(12) United States Patent
Numaguchi et al.

(10) Patent No.: US 8,093,927 B2
(45) Date of Patent: Jan. 10, 2012

(54) SEMICONDUCTOR DEVICE INCLUDING A TEST CIRCUIT OF A MULTIVALUED LOGIC CIRCUIT HAVING AN IMPEDANCE CONTROL

(75) Inventors: Yoshitomo Numaguchi, Kanagawa (JP); Munehisa Okita, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 19 days.

(21) Appl. No.: 12/654,286

(22) Filed: Dec. 16, 2009

(65) Prior Publication Data

US 2010/0219872 A1 Sep. 2, 2010

(30) Foreign Application Priority Data

Feb. 27, 2009 (JP) ................. 2009-045331

(51) Int. Cl.
*H03K 3/00* (2006.01)
(52) U.S. Cl. ...................................... 327/108
(58) Field of Classification Search ................... 327/308
See application file for complete search history.

(56) References Cited

U.S. PATENT DOCUMENTS 5,394,511 A * 2/1995 Mashiko .................... 706/33
2007/0273350 A1* 11/2007 Yamamoto .................... 323/284

FOREIGN PATENT DOCUMENTS

JP 3-209181 9/1991

* cited by examiner

*Primary Examiner* — Lincoln Donovan
*Assistant Examiner* — Daniel Rojas
(74) *Attorney, Agent, or Firm* — McGinn Intellectual Property Law Group, PLLC (57) ABSTRACT

A semiconductor device, having a test circuit of a multivalued logic circuit without newly provision of an output terminal for a test signal, and with no increase in transmission delay in an output signal, includes an n-valued input terminal, and comparators that operate at different threshold voltages in response to input signals which have been input to the n-valued input terminal, respectively, and also includes an impedance control circuit that is connected to the n-valued input terminal and outputs of the comparators, respectively, and changes a combine resistance value in response to the output signals of the comparators to change a current flowing in the n-valued input terminal.

11 Claims, 10 Drawing Sheets

| EXTERNAL INPUT TERMINAL MULTIVALUED INPUT | COMPARATOR OUTPUT BINARY OUTPUT (0=0V, 1=1.2V INTERNAL VOLTAGE) | | |
|---|---|---|---|
| Y0 | C1 | C2 | C3 |
| 0V | 0 | 0 | 0 |
| 1.2V | 1 | 0 | 0 |
| 2.2V | 1 | 1 | 0 |
| 3.3V | 1 | 1 | 1 |

VT: THRESHOLD VOLTAGE

FIG. 12 (Related Art)

SEMICONDUCTOR DEVICE INCLUDING A TEST CIRCUIT OF A MULTIVALUED LOGIC CIRCUIT HAVING AN IMPEDANCE CONTROL

BACKGROUND OF THE INVENTION

1. Field of the Invention

The present invention relates to a semiconductor device, and more particularly to a semiconductor device having a test circuit of a multivalued logic circuit.

2. Background of the Invention

In the semiconductor device field, with the large-scaled system and the increasing number of logic gates to be mounted, the number of input/output terminals is also remarkably increased. However, the number of input/output terminals that can be mounted on the semiconductor device is limited by a package. For that reason, there is a case in which a larger package must be employed when the number of input/output terminals exceeds a mountable limit. Under the circumstances, a reduction in the number of input/output is executed by using the multivalued logic circuit. However, there is a need to provide the semiconductor device with a test-use output terminal, which leads to a problem on a reduction in the number of terminals. Further, the number of multivalued logics that can be dealt with in the individual multivalued logic circuits is increased, whereby a technique enabling the multivalued logic circuit to be efficiently tested is increasingly required.

As a test of the semiconductor device including the multivalued logic circuit, there is a threshold voltage test of the multivalued input terminal. JP-A-03-209181 has proposed a method for reducing the number of terminals to be used in a threshold voltage test.

Figure 9:
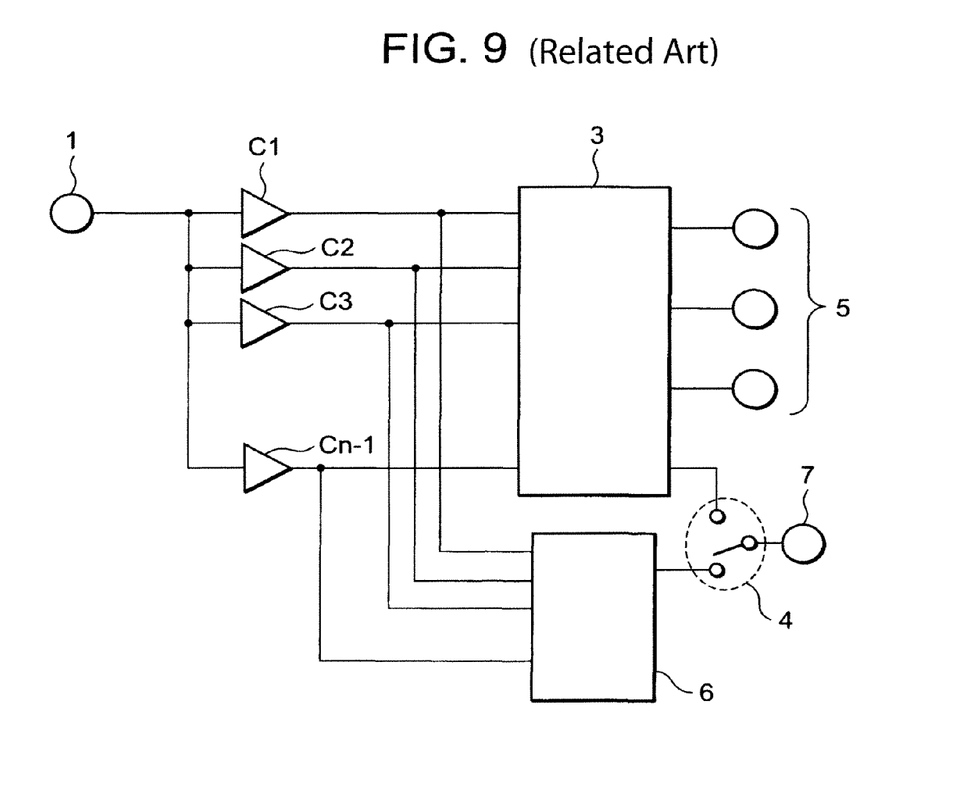
FIG. 9 is a circuit configuration diagram showing a semiconductor device.

First, a description will be given of the configuration of a semiconductor device discloses in JP-A-03-209181 with reference to FIG. 9. As shown in FIG. 9, an n-valued input terminal 1 is connected with (n−1) comparators C1 to Cn−1. The comparators C1 to Cn−1 are connected to an internal logic 3 and a threshold voltage test circuit 6, respectively. Output terminals 5 are connected to the internal logic 3, respectively, and an output terminal 7 is connected to the internal logic 3 or the threshold voltage test circuit 6 through an output mode selector switch 4. The respective comparators C1 to Cn−1 are set with threshold voltages different gradually such as V1<V2< . . . <Vn−1, respectively.

The operation of testing the semiconductor device shown in FIG. 9 will be described. First, in order to observe an output signal of the threshold voltage test circuit 6 by using the output terminal 7, the output mode selector switch 4 changes over to connect the threshold voltage test circuit 6 and the output terminal 7.

In that state, an input voltage of the n-valued input terminal 1 is sequentially raised from 0 volt, an output signal of the comparator C1 whose threshold voltage is V1 changes to "H" level from "L" level. When the input voltage is raised as it is, an output signal of the comparator C2 whose threshold voltage is V2 changes to "H" level from "L" level. This operation is sequentially repeated with the results that an output signal of the comparator Cn−1 whose threshold voltage is Vn−1 finally changes to "H" level from "L" level.

Figure 10:
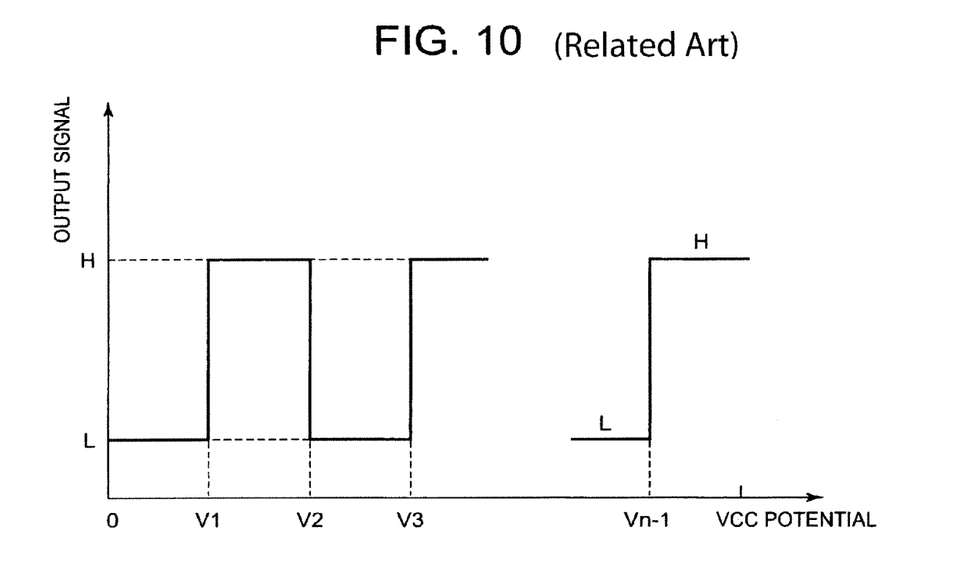
FIG. 10 is a characteristic diagram showing a threshold voltage test circuit.

In this situation, as shown in FIG. 10, a test output signal of the threshold voltage test circuit 6 is also inverted every time the output signals of the comparators C1 to Cn−1 are inverted. That is, an output signal observed at the output terminal is inverted when the input voltage of the n-valued input terminal 1 first reaches V1 volt, and again inverted when the input voltage then reaches V2 volt. This operation is repeated, and when the input voltage of the n-valued input terminal 1 reaches Vn−1 volt, (n−1)-th inversion is conducted.

Accordingly, when the voltage of the n-valued input terminal 1 when the test output signal is inverted is measured, and compared with the threshold voltages of the comparators C1 to Cn−1, it is possible to determine whether the comparators C1 to Cn−1 normally operate, or not.

Figure 11:
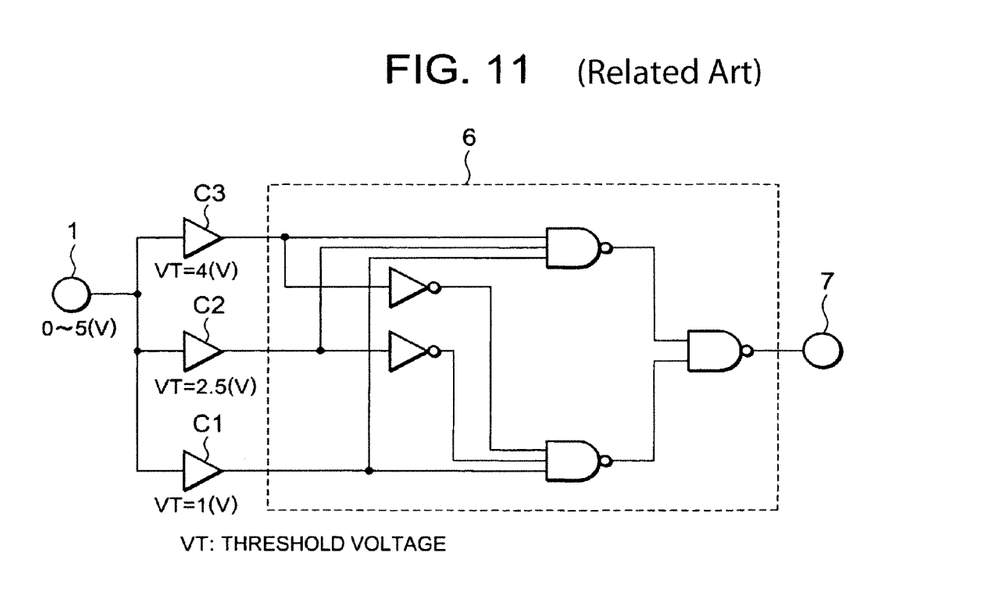
FIG. 11 is a circuit configuration diagram showing a semiconductor device in the case of four-valued input.
Figure 12:
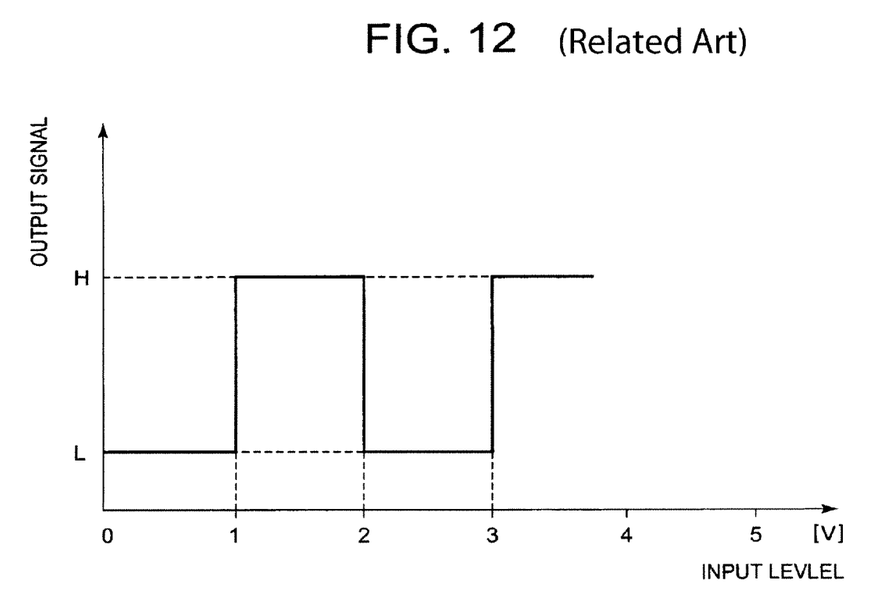
FIG. 12 is a circuit configuration diagram showing a threshold voltage test circuit in the case of four-valued input.

The above description is applied to a case of typical n-valued input. A specific example of four-valued input will be described. FIG. 11 is a circuit configuration diagram showing the configuration of the threshold voltage test circuit 6 in the case of four-valued input. As shown in FIG. 11, the threshold voltage test circuit 6 includes two inversion logic blocks and three NAND logic blocks. The threshold voltage test circuit 6 is connected to the n-valued input terminal 1 through the comparators C1 to C3, and also to the output terminal 7. With the above configuration, the threshold voltage test circuit 6 sequentially generates inversion logic according to the output signals of the comparators C1 to C3, as shown in a characteristic diagram of FIG. 12.

SUMMARY

In the above-described semiconductor device, the test output signal from the threshold voltage test circuit 6 is observed by using the output terminal 7. Hence, the output mode selector switch 4 naturally required in the normal operation must be provided. That is, even in the normal operation, the output signal from the internal logic 3 is transmitted to the output terminal 7 via the output mode selector switch 4. Because this output signal, as compared with other output signals to be transmitted to the output terminal 5, passes through the output mode selector switch 4, there arises, such a problem that a transmission delay occurs. As a result, the output signals from the output terminal 5 and the output terminal 7, which should be naturally synchronized with each other, are not synchronous with each other.

According to an aspect of the present invention, a semiconductor device includes: an input terminal to which an input signal is input; plural comparators that operate at different threshold voltages in response to the input signal that has been input to the input terminal, respectively; and an impedance control circuit that is connected to the input terminal and the outputs of the plural comparators, respectively, and changes a combined resistance value in response to output signals of the plural comparators, thereby changing a current which flows in the input terminal.

According to the present invention, since the operation of the comparators can be tested by only measuring a value of a current flowing in the input terminal to which the input signal is input, there is no need to newly provide an output terminal for observing the test output signal. Also, since there is no need to provide the output mode selector switch for outputting the test output signal by using the output terminal of the multivalued logic circuit, an increase in the transmission delay of the output signal of the multivalued logic circuit can be prevented.

According to the present invention, there can be provided the semiconductor device having the test circuit of the multivalued logic circuit without newly provision of the output terminal for the test signal, and with no increase in the transmission delay in the output signal.

DETAILED DESCRIPTION OF THE PREFERRED EMBODIMENTS

First Embodiment of the Invention

Figure 1:
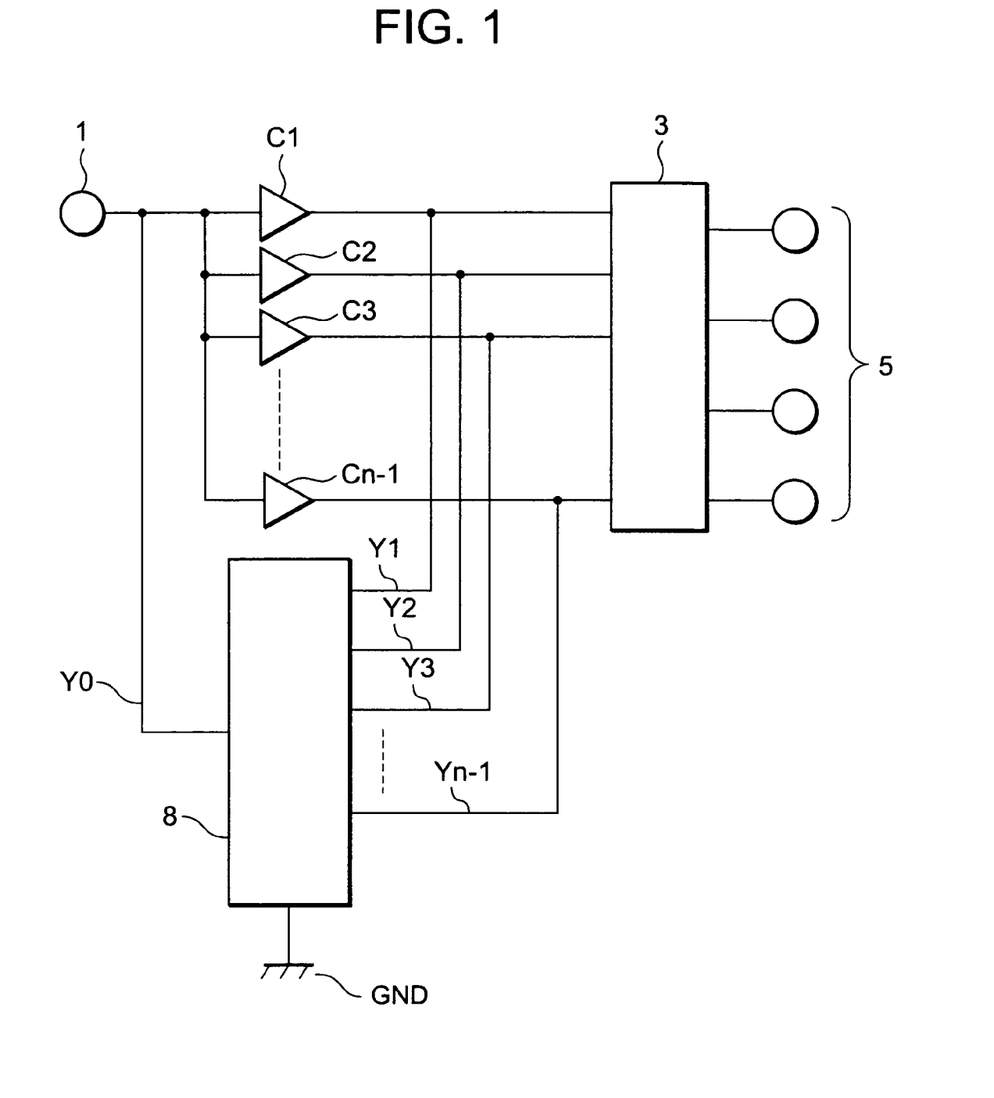
FIG. 1 is a circuit configuration diagram showing a semiconductor device according to a first embodiment of the present invention.

First, a description will be given of a circuit configuration of a semiconductor device according to a first embodiment of the present invention with reference to FIG. 1. As shown in FIG. 1, the semiconductor device includes an n-valued input terminal 1 (n is a natural number of 3 or more), (n−1) comparators C1 to Cn−1, an internal logic 3, output terminals 5, an impedance control circuit 8, an input node Y0, and (n−1) comparator output nodes Y1 to Yn−1.

The n-valued input terminal 1 receives an n-valued signal from the external of the semiconductor device.

The comparators C1 to Cn−1 are set with different threshold voltages V1 to Vn−1 which satisfy a relationship of V1<V2< . . . <Vn−1, respectively. Each of the comparators C1 to Cn−1 outputs a signal "0" when an input voltage of the n-valued signal is lower than a threshold voltage. On the other hand, each comparator outputs a signal "1" when the input voltage of the n-valued signal is equal to or higher than the threshold voltage.

The internal logic 3 operates upon receiving the output signals of the comparators C1 to Cn−1, and outputs a signal to the output terminals 5.

Figure 2:
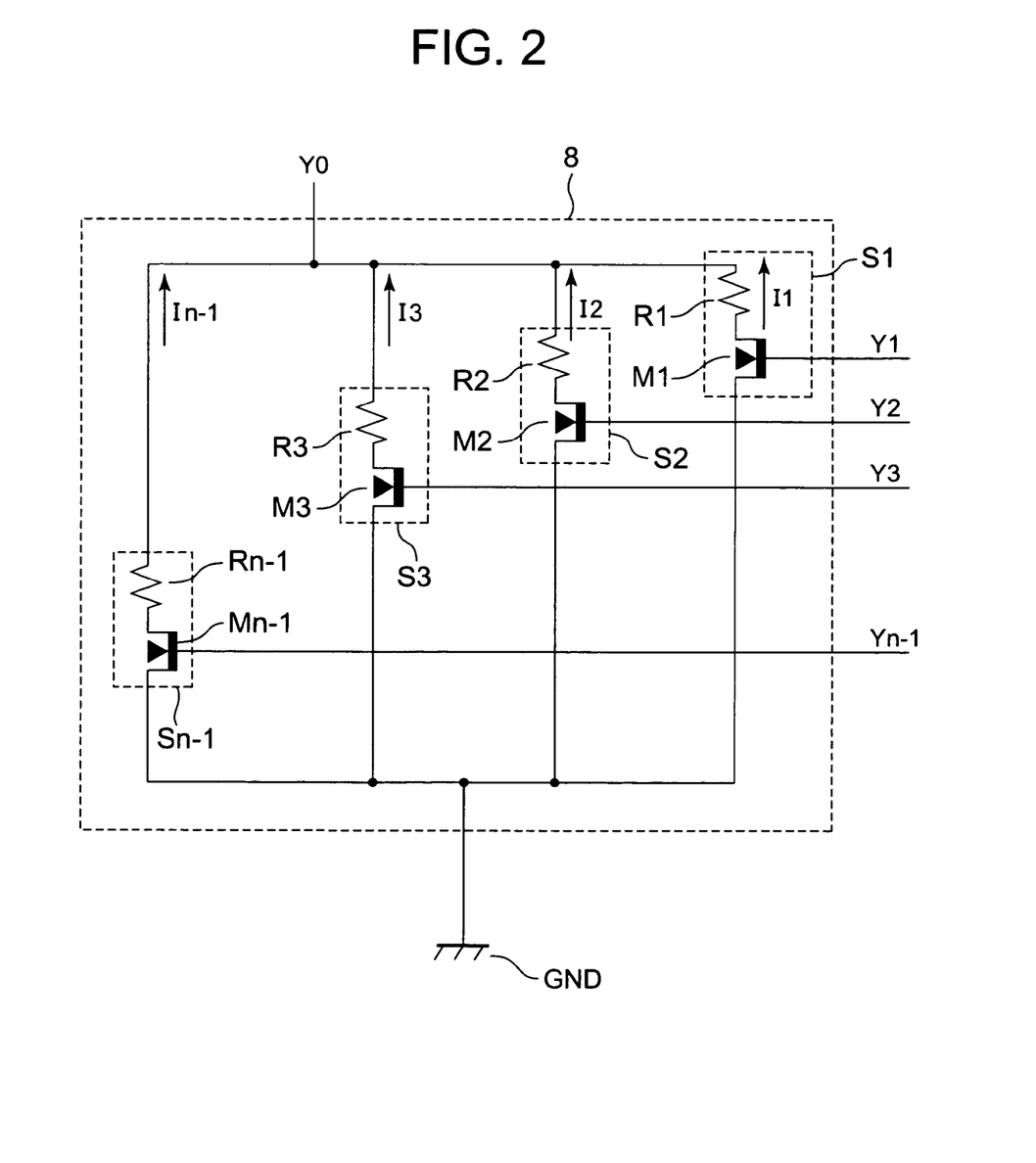
FIG. 2 is a circuit configuration diagram showing an impedance control circuit according to the first embodiment of the present invention.

The configuration of the impedance control circuit 8 will be described with reference to FIG. 2. As shown in FIG. 2, (n−1) impedance switch circuits S1 to Sn−1 are connected in parallel between the input node Y0 and a ground potential being a reference potential. The impedance switch circuits S1 to Sn−1 are made up of n-channel transistors M1 to Mn−1, and resistors R1 to Rn−1, respectively. Gates of the n-channel transistors M1 to Mn−1 are connected with the comparator output nodes Y1 to Yn−1, respectively. Sources of the n-channel transistors M1 to Mn−1 are connected to the ground potential being the reference potential. Drains of the n-channel transistors M1 to Mn−1 are connected to the input node Y0 through pull-down resistors R1 to Rn−1, respectively.

Subsequently, the operation of the semiconductor device shown in FIG. 1 will be described. When the input voltage which is applied to the n-valued input terminal 1 sequentially increases from 0 volt, the output signal of the comparator C1 first reaches "1". When the input voltage sequentially increases, the output signal of the comparator C2 then reaches "1". Likewise, when the input voltage sequentially increases, the output signal of the comparator Cn−1 finally reaches "1".

The operation of the impedance control circuit 8 shown in FIG. 2 will be described. When the input voltage which is applied to the n-valued input terminal 1 sequentially increases from 0 volt, the output signal "1" of the comparator C1 is supplied to the n-channel transistor M1 through the comparator output node Y1. Hence, the n-channel transistor M1 turns on. Since a source of the n-channel transistor M1 is connected with the ground potential, and a drain thereof is connected with the resistor R1, a current I1 produced by a potential difference between the input voltage of the n-valued input terminal 1 and the ground potential flows into the impedance switch circuit S1.

When the input voltage sequentially increases, the output signal "1" of the comparator C2 is supplied to the n-channel transistor M2 through the comparator output node Y2. Hence, the n-channel transistor M2 turns on, and a current I2 flows into the impedance switch circuit S2. Likewise, when the input voltage sequentially increases, the output signal "1" of the comparator Cn−1 is finally supplied to the n-channel transistor Mn−1 through the comparator output node Yn−1. Hence, the n-channel transistor Mn−1 turns on, and a current In−1 flows into the impedance switch circuit Sn−1. That is, with an increase in the input voltage, the impedance switch circuits S1 to Sn−1 are sequentially rendered conductive, a combined resistance value of the entire impedance control circuit 8 decreases, and a current I (I=I1+I2+ . . . +In−1) flowing in the n-valued input terminal 1 increases.

In this situation, when the resistance values of the resistors R1 to Rn−1 are set in advance, a relationship between the input voltage which is applied to the n-valued input terminal 1 and the current I can be known. Accordingly, through observation of the current I, it is possible to determine whether the comparators C1 to Cn−1 normally operate at the set threshold voltages, or not.

That is, the operation of the comparators C1 to Cn−1 can be tested by using the originally existing n-valued input terminal 1. Hence, there is no need to provide the output mode selector switch 4 shown in FIG. 9.

Hence, the delay of the output signal from the internal logic 3 can be prevented from increasing.

Further, since an increase in the delay of the output signal may not be taken into consideration, there is no need to provide the internal logic 3 with a delay compensation unit for the output signal, and a timing design of the internal logic gets facilitated.

A control terminal and a wiring for controlling the above-described switch circuit are not required. Hence, it is possible to reduce the number of terminals in the semiconductor device, and to substantially enlarge an internal region of the semiconductor device.

Also, according to the configuration of FIG. 9, the threshold voltage must be determined by counting the number of toggles of the output signal. In conducting a test, there is required a test time taking, into consideration, a delay time of the threshold voltage test circuit 6, a delay time at the output mode selector switch 4, and a delay time of the output circuit. That is, a voltage to be applied to the n-valued input terminal 1 must be sequentially changed from 0V to a supply voltage while taking time. However, according to the above-described configuration, since a relationship between the input voltage and the current I flowing in the n-valued input terminal 1 has been known, it is only necessary to measure the current I, and the test time can be reduced.

Also, in the typical semiconductor device, there is a need to set a combination of the input terminal of the multivalued input circuit to be measured with the output terminals from which the test results are output, and to create a test program for switching between a test mode and a normal operation mode. However, according to this configuration, since only the input terminal of the n-valued input circuit is used, there is no need to switch between the test mode and the normal operation mode, thereby enabling a test to be conducted by a simpler test program. Accordingly, a period of time for creating the test program can be reduced.

FIRST EXAMPLE

Figure 3:
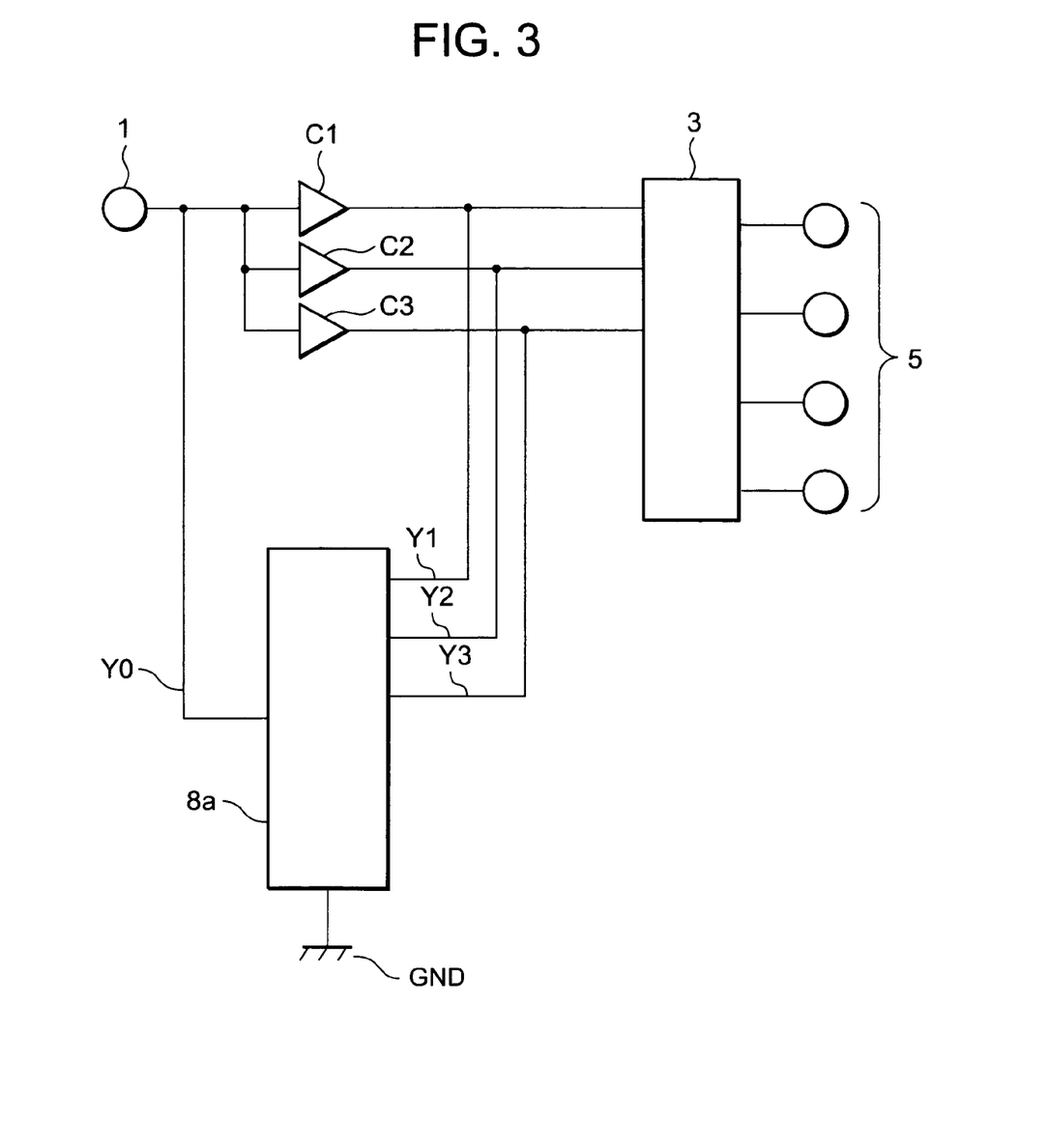
FIG. 3 is a circuit configuration diagram showing a semiconductor device according to a first example.

The configuration of a semiconductor device according to a first example will be described with reference to FIG. 3. FIG. 3 shows a circuit configuration of the semiconductor device shown in FIG. 1 in the case of inputting a four-valued input signal. Accordingly, in FIG. 3, there are disposed three comparators C1 to C3, three comparator output nodes Y1 to Y3, and an impedance control circuit 8a accepting four-valued input. Other configurations are identical with those in FIG. 1, and therefore duplicate description will be omitted. The respective threshold voltages are 0.8 V in the comparator C1, 1.6 V in the comparator C2, and 2.5 V in the comparator C3.

Figure 4:
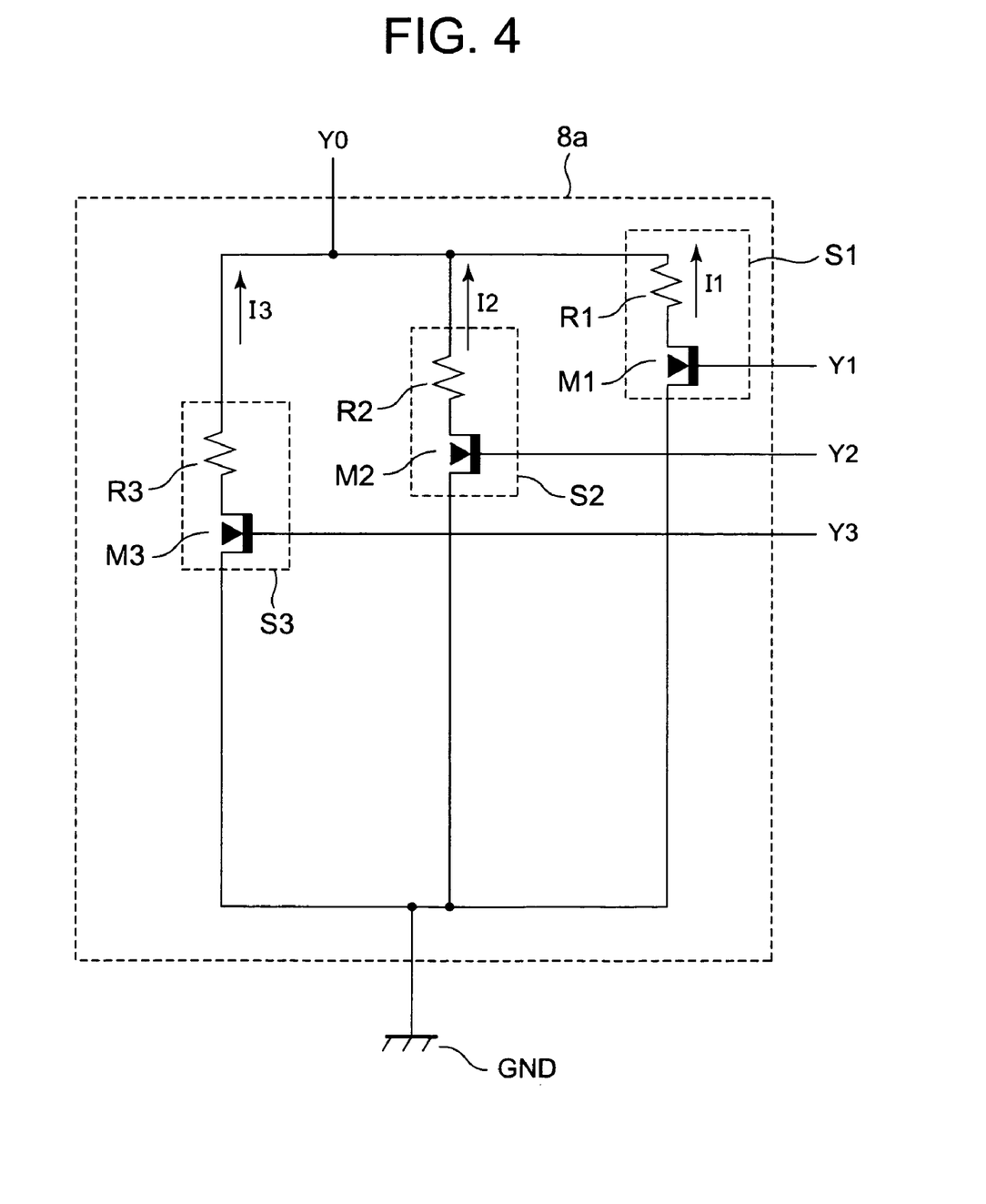
FIG. 4 is a circuit configuration diagram showing an impedance control circuit according to the first example.

The configuration of the impedance control circuit 8a will be described with reference to FIG. 4. Because the impedance control circuit 8a accepts a four-valued input signal, the impedance control circuit 8a has three impedance switch circuits S1 to S3. Other configurations are identical with those in FIG. 2, and therefore their description will be omitted. Resistance values of the impedance switch circuits S1 to S3 are 30 kΩ, respectively.

Figure 5:
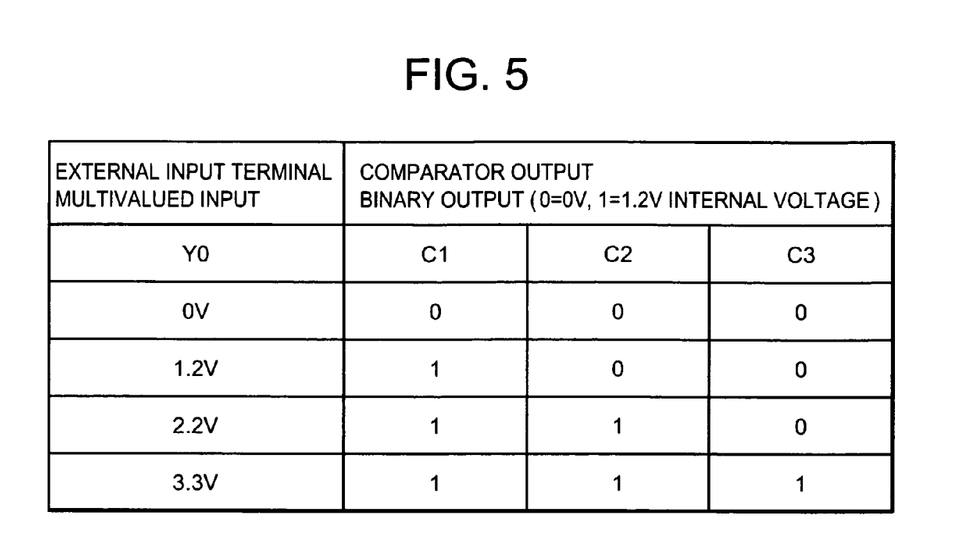
FIG. 5 is a true value table showing comparator outputs according to the first example.

The operation of the semiconductor device according to the first example will be described with reference to FIGS. 3 and 5. When, for example, 0 V is applied to the n-valued input terminal 1 as the input voltage, the output signals of the comparators C1, C2, and C3 are "0", "0", and "0", respectively.

When, for example, 1.2 V is applied to the n-valued input terminal 1 as the input voltage, the output signals of the comparators C1, C2, and C3 are "1", "0", and "0", respectively.

When, for example, 2.2 V is applied to the n-valued input terminal 1 as the input voltage, the output signals of the comparators C1, C2, and C3 are "1", "1", and "0", respectively.

When, for example, 3.3 V is applied to the n-valued input terminal 1 as the input voltage, the output signals of the comparators C1, C2, and C3 are "1", "1", and "1", respectively.

Figure 6:
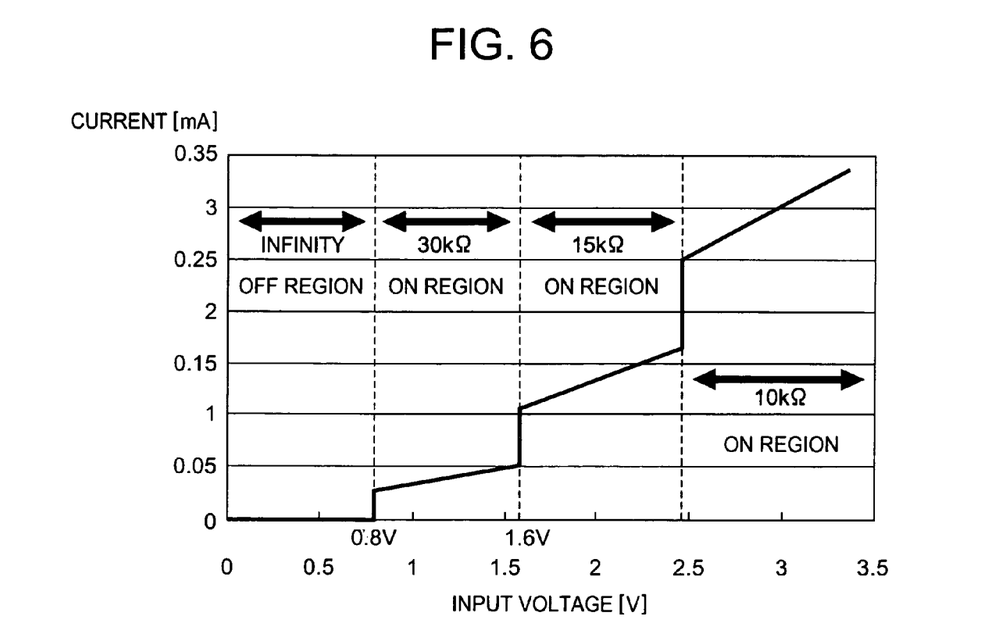
FIG. 6 is a characteristic diagram showing the semiconductor device according to the first example.

FIG. 6 shows a relationship between the input voltage applied to the n-valued input terminal 1 and the current I flowing in the n-valued input terminal 1. When the input voltage ranges from 0 V to 0.8 V, because all of the n-channel transistors M1 to M3 shown in FIG. 4 get in an off state, the combined resistance value of the impedance control circuit 8a becomes infinite, and no current I flows.

When the input voltage ranges from 0.8 V to 1.6 V, only the n-channel transistor M1 gets in an on state, and the n-channel transistors M2 and M3 get in the off state. Therefore, the combined resistance value of the impedance control circuit 8a becomes 30 KΩ. Accordingly, the current I corresponding to the combined resistance value 30 KΩ of the impedance control circuit 8a flows in the n-valued input terminal 1.

When the input voltage ranges from 1.6 V to 2.5 V, the n-channel transistors M1 and M2 get in the on state, and the n-channel transistor M3 get in the off state. Therefore, the combined resistance value of the impedance control circuit 8a becomes 15 KΩ. Accordingly, the current I corresponding to the combined resistance value 15 KΩ of the impedance control circuit 8a flows in the n-valued input terminal 1.

When the input voltage is equal to or higher than 2.5 V, all of the n-channel transistors M1 to M3 get in the on state. Therefore, the combined resistance value of the impedance control circuit 8a becomes 10 KΩ. Accordingly, the current I corresponding to the combined resistance value 10 KΩ of the impedance control circuit 8a flows in the n-valued input terminal 1.

Hence, as shown in FIG. 6, a change in the input voltage applied to the n-valued input terminal 1 and the current I are measured, thereby making it possible to determine whether the comparators C1 to C3 normally operate at the threshold voltages set for the respective comparators, or not.

Second Embodiment of the Invention

A second embodiment of the present invention changes the configuration of the impedance control circuit in the first embodiment of the invention.

Figure 7:
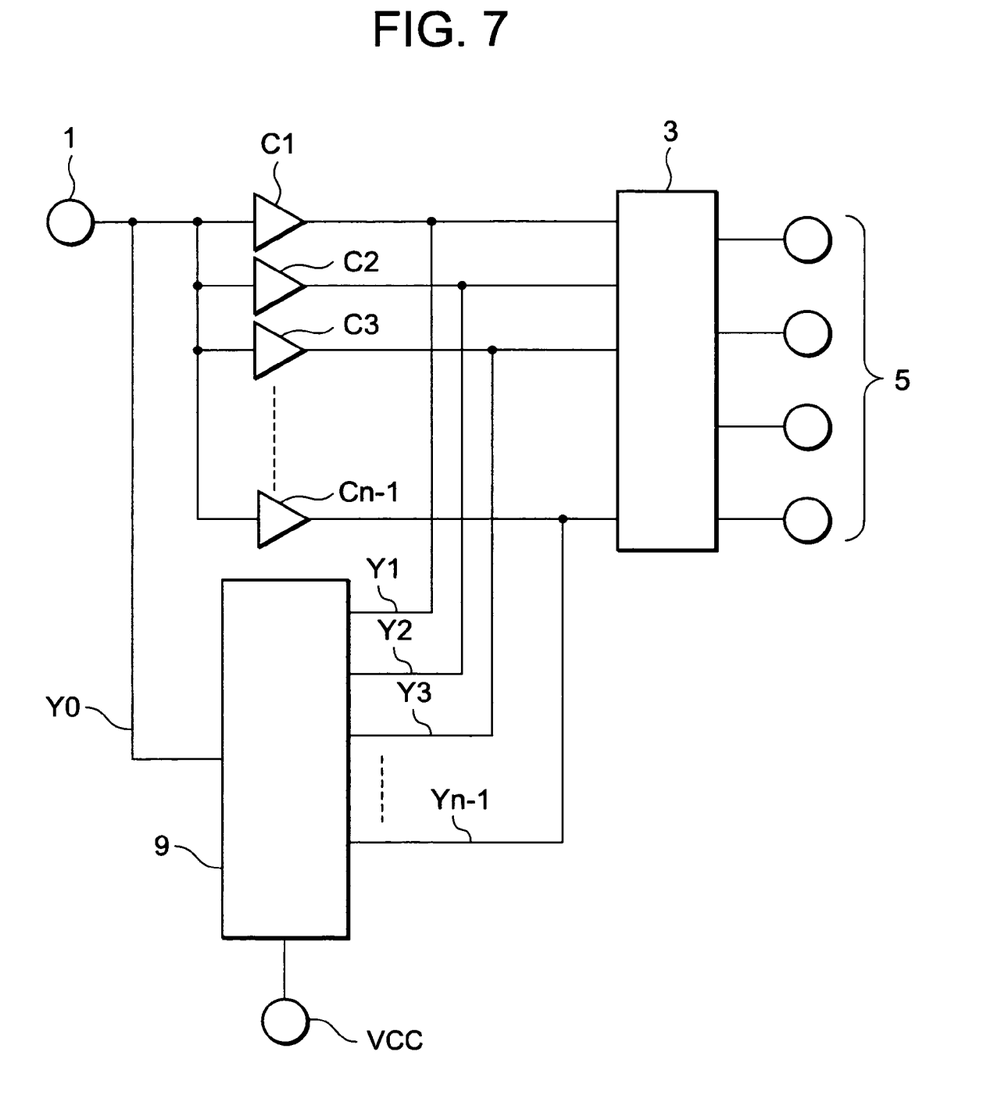
FIG. 7 is a circuit configuration diagram showing a semiconductor device according to a second embodiment of the present invention.

First, the configuration of a semiconductor device according to the second embodiment of the present invention will be described with reference to FIG. 7. In FIG. 7, the impedance control circuit 8 in FIG. 1 is substituted with an impedance control circuit 9. Also, the comparators C1 to Cn−1 are set with different threshold voltages V1 to Vn−1 which satisfy a relationship of V1>V2>...>Vn−1, respectively. Other configurations are identical with those in FIG. 1, and therefore their description will be omitted.

Figure 8:
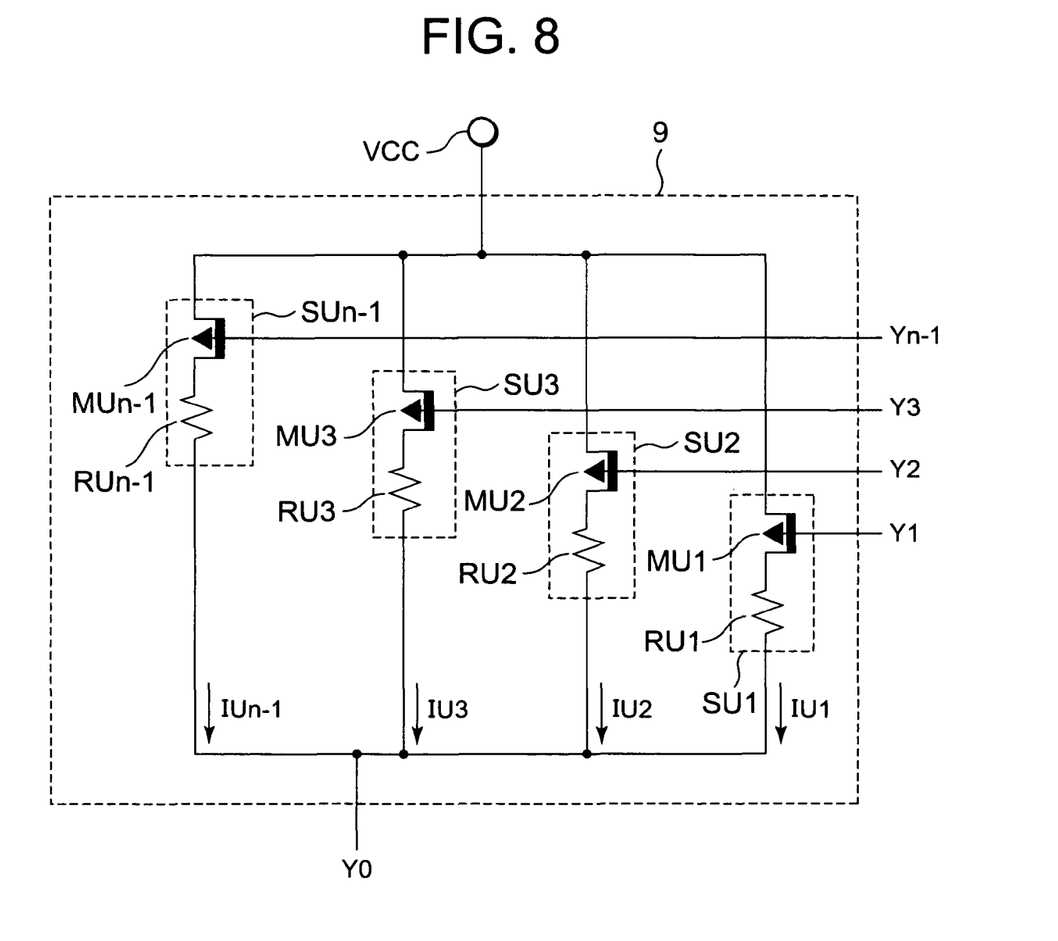
FIG. 8 is a circuit configuration diagram showing an impedance control circuit according to the second embodiment of the present invention.

The circuit configuration of the impedance control circuit 9 will be described with reference to FIG. 8. As shown in FIG. 8, (n−1) impedance switch circuits SU1 to SUn−1 are arranged between the input node Y0 and a ground potential being a reference potential. The impedance switch circuits SU1 to SUn−1 are made up of p-channel transistors MU1 to MUn−1, and resistors RU1 to RUn−1, respectively. Gates of the p-channel transistors MU1 to MUn−1 are connected with the comparator output nodes Y1 to Yn−1, respectively. Sources of the p-channel transistors MU1 to MUn−1 are connected to a power potential being the reference potential. Drains of the p-channel transistors MU1 to MUn−1 are connected to the input node Y0 through pull-up resistors RU1 to RUn−1, respectively.

The operation of the semiconductor device shown in FIG. 7 will be described. When the input voltage which is applied to the n-valued input terminal 1 sequentially decreases from the supply voltage, the output signal of the comparator C1 first reaches "0". When the input voltage sequentially decreases, the output signal of the comparator C2 then reaches "0". Likewise, when the input voltage sequentially decreases, the output signal of the comparator Cn−1 finally reaches "0".

The operation of the impedance control circuit 9 shown in FIG. 8 will be described. When the input voltage which is applied to the n-valued input terminal 1 sequentially decreases from the supply voltage, the output signal "0" of the comparator C1 is supplied to the p-channel transistor MU1 through the comparator output node Y1. Hence, the p-channel transistor MU1 turns on. Since a source of the p-channel transistor MU1 is connected with the power potential, and a drain thereof is connected with the resistor RU1, a current IU1 produced by a potential difference between the input voltage of the n-valued input terminal 1 and the power potential flows into the impedance switch circuit SU1.

When the input voltage sequentially decreases, the output signal "0" of the comparator C2 is supplied to the p-channel transistor MU2 through the comparator output node Y2. Hence, the p-channel transistor MU2 turns on, and a current IU2 flows into the impedance switch circuit SU2. Likewise, when the input voltage sequentially decreases, the output signal "0" of the comparator Cn−1 is finally supplied to the p-channel transistor MUn−1 through the comparator output node Yn−1. Hence, the p-channel transistor MUn−1 turns on, and a current IUn−1 flows into the impedance switch circuit SUn−1. That is, with a decrease in the input voltage, the impedance switch circuits SU1 to SUn−1 are sequentially rendered conductive, a combined resistance value of the entire impedance control circuit 9 decreases, and a current IU (IU=IU1+IU2+ . . . +IUn−1) flowing in the n-valued input terminal 1 increases.

In this situation, when the resistance values of the resistors RU1 to RUn−1 are set in advance, a relationship between the input voltage which is applied to the n-valued input terminal 1 and the current IU can be known. That is, according to this configuration, the observation of the current IU makes it possible to determine whether the comparators C1 to Cn−1 normally operate at the set threshold voltages, or not. Accordingly, the same functions as those of the semiconductor device shown in FIG. 1 can be realized.

The present invention is not limited to or by the above embodiments, but can be appropriately changed without departing from the subject matter of the invention. For example, the impedance control circuit or the impedance switch circuits may be of other configurations if the same functions can be realized.

In the above-described embodiments, the internal logic and the impedance control circuit are separated from each other, but the impedance control circuit may be incorporated into the internal logic. Further, the impedance switch circuits may be dispersed into a logic circuit configuring the internal logic.

What is claimed is:

1. A semiconductor device, comprising:
   an input terminal to which an input signal is input;
   a plurality of comparators that operate at different threshold voltages in response to the input signal that has been input to the input terminal, respectively; and
   an impedance control circuit that is connected to the input terminal and the outputs of the plurality of comparators, respectively, and changes a combined resistance value in response to output signals of the plurality of comparators to change a current which flows in the input terminal.

2. The semiconductor device according to claim 1, wherein the impedance control circuit includes impedance switch circuits connected in parallel between the input terminal and a reference potential.

3. The semiconductor device according to claim 2, wherein control terminals of the impedance switch circuits are connected to output terminals of different comparators, respectively, and
   wherein the impedance switch circuits conduct switching operation in response to the output signals.

4. The semiconductor device according to claim 2, wherein the impedance switch circuits each include a switching element and a resistor.

5. The semiconductor device according to claim 4, wherein the switching element comprises an n-channel transistor, and
   wherein the reference potential is a ground potential.

6. The semiconductor device according to claim 4, wherein the switching element comprises a p-channel transistor, and
   wherein the reference potential is a power potential.

7. The semiconductor device according to claim 3, wherein the impedance switch circuits each include a switching element and a resistor.

8. The semiconductor device according to claim 1, wherein the plurality of comparators output logic states according to the input signal and the threshold voltages.

9. A semiconductor device, comprising:
   a test circuit of a multi-valued logic circuit, the test circuit comprising:
      an input terminal to which an input signal is input external from the test circuit;
      a plurality of comparators that operate at different threshold voltages in response to the input signal that has been input to the input terminal, respectively, the plurality of comparators output a plurality of output signals, with logic states according to the input signal and the threshold voltages; and
      an impedance control circuit that receives the input signal from the input terminal and the output signals from the plurality of comparators, respectively, and changes a combined resistance value in response to the output signals of the plurality of comparators to change a current which flows in the input terminal.

10. The semiconductor device according to claim 9, wherein the input terminal comprises an n-valued input terminal, where n is a natural number of 3 or more.

11. The semiconductor device according to claim 10, wherein the n-valued input terminal is to be measured in a test and void of switching between a test mode and a normal operation mode.

* * * * *